United States Patent
Gaalaas et al.

(10) Patent No.: US 6,226,758 B1
(45) Date of Patent: May 1, 2001

(54) SAMPLE RATE CONVERSION OF NON-AUDIO AES DATA CHANNELS

(75) Inventors: Eric C Gaalaas; Lei Jin; John Paulos, all of Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 08/940,274

(22) Filed: Sep. 30, 1997

(51) Int. Cl.$^7$ ........................................................ G06F 1/04
(52) U.S. Cl. .................................................................. 713/600
(58) Field of Search .................... 713/400, 503, 713/600

(56) References Cited

U.S. PATENT DOCUMENTS

| | | | |
|---|---|---|---|
| 5,333,299 | * 7/1994 | Koval et al. | 713/400 |
| 5,400,328 | * 3/1995 | Burren et al. | 370/294 |
| 5,512,895 | * 4/1996 | Madden et al. | 341/61 |
| 5,598,352 | * 1/1997 | Rosenau et al. | 395/806 |
| 5,790,746 | * 8/1998 | Kashida et al. | 386/116 |
| 5,848,266 | * 12/1998 | Scheurich | 713/503 |

* cited by examiner

*Primary Examiner*—Dennis M. Butler
(74) *Attorney, Agent, or Firm*—Steven Lin

(57) ABSTRACT

An sample rate converter for non-audio AES data channels is presented. Channel status (C) information is transferred in 192-bit blocks. Access to received C channel data blocks is allowed, before the blocks are re-transmitted at the output sample rate. This enables users to modify the data, alleviating the effect of data loss caused by different input and output sample frequencies. For U channel status information, U channel status information is transferred as 2×192 bit blocks like the channel status (C) scheme above, as individual information units (IUs), or as messages consisting of 129 IUs. In the latter 2 schemes, the lengths of output inter-IU filler segments or output intermessage filler segments are varied relative to the lengths of inputs inter-IU filler segments or input inter-IU message segments respectively, to compensate for the difference between the input sample frequency and the output sample frequency.

29 Claims, 9 Drawing Sheets

| P | Q | R | S | T | U | V | W |
|---|---|---|---|---|---|---|---|
| 1 | X | X | X | X | X | X | X |
FIG. 7A
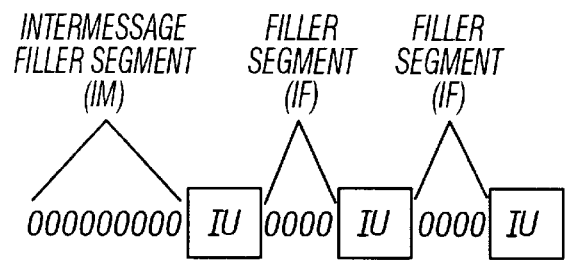
FIG. 7B
FIG. 8

SAMPLE RATE CONVERSION OF NON-AUDIO AES DATA CHANNELS

BACKGROUND OF THE INVENTION

1. Field of the Invention

The invention generally relates to digital signal processing and more particularly to sample rate conversion.

2. Description of the Related Art

As computer systems find increased applications in every day life, sample rate conversion is becoming necessary in more situations. In general, a sample rate converter (SRC) converts a digital signal having a first sample frequency to a substantially similar digital signal having a second sample frequency. This allows two digital processing systems operating at two different sample frequencies/rates to transfer and process each other's signals. In the audio industry, applications of an SRC are numerous given that no standard sample rate has been adopted for all applications. For example, while a sample rate of 48 kHz is generally used in compact disc (CD) recording, 44.1 kHz is used for CD playback. Similarly, while digital audio tape (DAT) generally has a sample rate of 48 kHz, motion-picture-expert-group (MPEG) and Dolby AC-3 may have sample rates of 48 kHz, 44.1 kHz, 32 kHz, or half of any of these rates. Even if two separate systems have the same nominal sampling rate, they may not share the same master clock, in which case sample rate conversion is still required.

There are three well-known methods of sample rate conversions: digital-analog-digital (DAD), synchronous, and asynchronous. The most direct method of sample rate conversion is DAD. Under the DAD method, a digital-to-analog (D/A) converter converts an input digital signal into an analog signal. The analog signal, which consists of infinitely many repetitions of a frequency spectrum centered on multiples of the sampling frequency is then sent to a lowpass filter to filter out the repetitions of the frequency spectrum and leave only the baseband frequency spectrum. An analog-to-digital (A/D) converter is next used in resampling the analog signal from the A/D converter at sample frequency $F_{s2}$ to convert the analog signal back into a digital signal. If $F_{s2}$ is greater than $2 \times (F_{s1}/2)$, Shannon's sampling theorem is met and the original signal can be reconstructed completely from the sampled signal D.

For the synchronous sample rate conversion method, as its name suggests, the input and output sample frequencies originate from a master source. In other words, the input sample frequency is related to the output sample frequency by a ratio of integers (e.g., 3:2). In synchronous sample rate conversion, an input digital signal, which has a sample frequency $F_{s1}$ is provided as input to an interpolator. The interpolator interpolates the input digital signal by an integer factor U to increase the sample frequency to that of the least common multiple (LCM) frequency of the two sample frequencies, $F_{s1}$ and $F_{s2}$. Generally, in an interpolation operation, samples of value zero are inserted at sample times between the samples of the input signal. Since samples are added while the time span remains the same, the interpolated signal has a higher sampling rate than the input signal. The interpolated signal is next provided as input to a lowpass filter to eliminate unwanted periodic repetitions of the frequency spectrum between the frequency range $0<f<2\pi$. The lowpass filter outputs a filtered signal to a decimator which downsamples the filtered signal by an integer factor D and scales the spectral replicas at 0 and $2\pi$ to produce a signal having a sample frequency of 30 kHz. Accordingly, the integer factor D has a value of two (2).

Asynchronous sample rate conversion can convert between any two input and output sample frequencies. In other words, for asynchronous sample rate conversion, the ratio of the input sample frequency and the output sample frequency may be irrational or the ratio of the input sample frequency and the output sample frequency may be rational but the LCM frequency is too high for synchronous sample rate conversion to be practical. In a typical Prior Art asynchronous sample rate converter such as that described in a publication titled "*Theory and VLSI Architectures for Asynchronous Sample Rate Converters*," Robert Adams and Tom Kwan, 94th Convention of the Audio Engineering Society, Berlin, Germany, 1993, an input digital signal is first oversampled/interpolated to a very high sample frequency $UF_{s1}$. Next, this high sample frequency signal $UF_{s1}$ is filtered by a low-pass filter before being resampled at another high frequency $DF_{s2}$. The high frequency signal is then downsampled by a factor of D to produce the output signal.

For digital audio data transfer, serial data specifications AES3-1992 and IEC-60958 promulgated by the Audio Engineering Society (AES) and the International Electrotechnical Commission (IEC), respectively, are the de facto digital audio interface standards in the industry.

Under the AES3-1992/IEC-60958 format, both audio data and non-audio data (i.e., contained in the U and C channels) are combined in the same data stream. Currently, in the Prior Art there are commercially available transceiver circuits, such as the TDA1315H from Philips™ Semiconductors of the Netherlands, to perform transfers of serial digital audio data that conform to the AES3-1992 and IEC-60958 specifications. Some of these transceiver circuits include a sample rate converter to convert an AES3-1992/IEC-60958 digital audio signal having a first sample frequency to a substantially similar digital signal having a second sample frequency. However, under the Prior Art, only the audio data portion of the AES3-1992/IEC-60958 data stream can be sample rate converted. The U and C non-audio data are generally lost when attempting sample rate conversion on AES3-1992/IEC-60958 data streams.

Thus, a need exists for an apparatus, system, and method to effectively and efficiently perform sample rate conversion of non-audio information contained in AES3-1992/IEC-60958 digital audio data streams.

SUMMARY OF THE INVENTION

Accordingly, the present invention provides an apparatus, system, and method to perform sample rate conversion of non-audio information contained in AES3-1992/IEC-60958 digital audio data streams by utilizing with a sample rate conversion technique for C channel data that are formatted in blocks of a predetermined size. Under the C channel data sample rate conversion technique of the present invention, entire blocks of data are stored in a buffer memory. More particularly, the buffer memory is organized into 3 block-sized pages D–F.

C channel data is first received and then sent to page D of the buffer memory at a rate of $2 \times F_{s1}$. When page D is filled with a complete C channel data block, its contents are transferred to page E. Upon transferring its contents to page E, page D begins filling with a new block of data. At the same time, the data block stored in page F is being emptied at a rate of $2 \times F_{s2}$. When page F is completely emptied, the contents of page E are transferred to page F. The transfer of data from page F resumes at the beginning of the just-transferred block. In accordance to the present invention, user access to data stored in page E is allowed for data monitoring and modification purposes. Furthermore, the present invention also has an overwrite-protection feature which allowed desired settings to be stored once in page E instead of repeatedly as a result of overwriting by data from page D.

The present invention also meets the above need with a sample rate conversion technique for U channel data. Since there is no universally accepted U format, the present invention provides a choice of three modes. The first U channel data sample rate conversion mode (i.e., the block mode) operates similarly to the C channel data sample rate conversion technique discussed above. The only exception is that the U channel data sample rate conversion does not have the overwrite-protection feature that the C channel data sample rate conversion does.

The second and third U channel data sample rate conversion modes are designed to handle U channel data formatted according to the IEC-60958 standard. More specifically, under this standard, U channel data are formatted in messages each having up to 129 information units (IUs). There are inter-message filler segments between messages and inter-IU filler segments between IUs. In the second U channel data sample rate conversion mode (i.e., the iec1 mode), input IUs which are received at a rate of $2 \times F_{s1}$ are copied to the output which transmits at a rate of $2 \times F_{s2}$. However, the length of output inter-IU filler segments are adjusted relative to the lengths of input inter-IU filler segments to accommodate the difference between $F_{s1}$ and $F_{s2}$.

For the third U channel data sample rate conversion mode (i.e., the iec2 mode), input IUs from a message are separated from filler segments and are first stored in a buffer memory which is clocked at a rate of $2 \times F_{s1}$. Hence, the minimum size of the buffer memory is 129×8 bits. The IUs in the buffer memory are transferred to an output buffer which serially outputs the IUs at a rate $2 \times F_{s2}$. To accommodate the difference between $F_{s1}$ and $F_{s2}$, the length of the output inter-message filler segment is adjusted relative to the length of the input inter-message filler segment. The output inter-message filler segment and the output inter-IU filler segments are inserted into the output of the output buffer.

All the features and advantages of the present invention will become apparent from the following detailed description of its preferred embodiment whose description should be taken in conjunction with the accompanying drawings.

BRIEF DESCRIPTION OF THE DRAWINGS

FIGS. 7A–7B illustrate the AES3-1992/IEC-60958 User data (U channel data) block structure.

FIG. 8 illustrates a block diagram summarizing the three stage of the sample rate conversion scheme for U data in accordance with the present invention.

DETAILED DESCRIPTION OF THE INVENTION

In the following detailed description of the present invention, numerous specific details are set forth in order to provide a thorough understanding of the present invention. However, it will be obvious to one skilled in the art that the present invention may be practiced without these specific details. In other instances well known methods, procedures, components, and circuits have not been described in detail as not to unnecessarily obscure aspects of the present invention.

Figure 1:
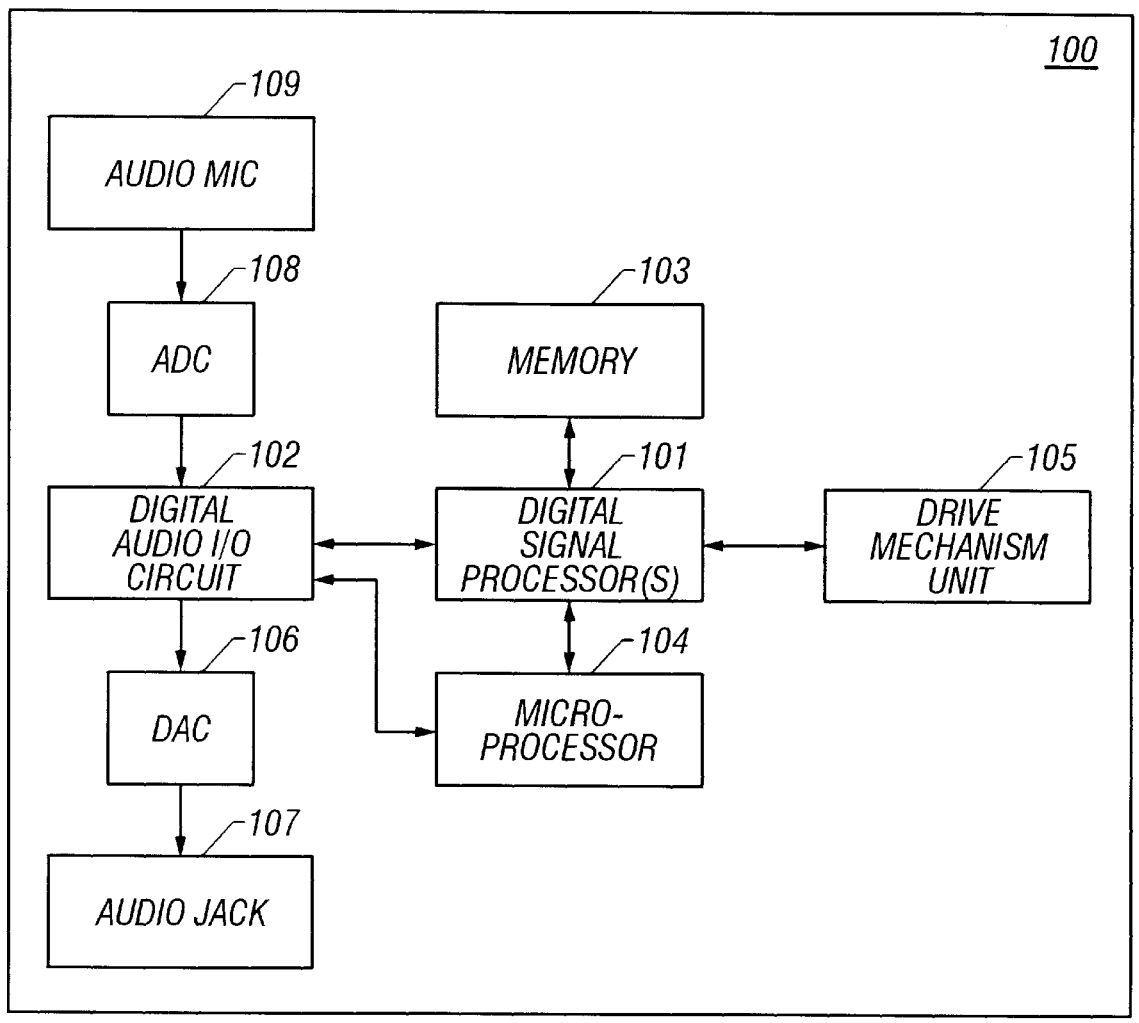
FIG. 1 is a block diagram illustrating a typical digital audio system which incorporates the present invention.

Reference is made to FIG. 1 illustrating an overview of a generalized digital audio system 100 in accordance with the present invention. Digital audio system 100 can be a Compact Disk (CD) player/recorder system, a Digital Audio Tape (DAT) system, a magnetic drive (MD) system, a video tape recorder (VTR) system, or others. As shown in FIG. 1, digital audio system 100 comprises at least one digital signal processor 101, digital audio input/output (I/O) circuit 102, memory 103, μprocessor/controller 104, drive mechanism unit 105, digital-to-analog (DAC) converter 106, audio jack 107, analog-to-digital (ADC) converter 108, and audio microphone 109.

Drive mechanism unit 105 includes a spindle motor to rotate the data storing medium (e.g., CD or magnetic tape) past read and record heads which respectively retrieve and record information from/to the data storing medium. To control the speed and position of the data storing medium, drive mechanism unit 105 implements a drive mechanism controller which, for example, may monitor the motor spindle revolution count and in response may generate pulse signals indicative of the revolution count. The pulse signal is subsequently utilized to control the spindle motor speeds and to determine amount of data storing medium played or recorded.

During a read operation, the read heads generate read signals in response to data pulses retrieved from the data storing medium. The read signals are subsequently sent to an amplifier prior to being provided as input to digital signal processor 101. On the other hand, during a record operation, digital signal processor 101 sends write data signals to drive mechanism unit 105 which in turn utilizes the record heads to write the data onto the data storing medium. It should be clear to a person of ordinary skill in the art that drive mechanism unit 105 is well-known and obvious.

Digital signal processor 101 may comprise a demodulator, a modulator, a decoder, and an encoder (all not shown). Digital signal processor 101 is normally operated under the control of μprocessor/controller 104. In a read operation, the amplified read signals from drive mechanism unit 105 are first stored in memory 103. By staying in communications with digital signal processor 101, memory 103, and drive mechanism unit 105, μprocessor/controller 104 determines when to supply the stored read signals to the demodulator for processing. The modulator provides an output having a serial bit stream that includes audio data and non-audio information. The output of the demodulator is subsequently provided to the decoder which provides, for example, error correction code (ECC) processing on the demodulated signals as well as decomposes the demodulated serial data into audio data and non-audio information. The output of the decoder is then provided as an input to digital audio I/O circuit 102 for processing. Conversely, in a write operation, the write signals from digital audio I/O circuit 102 is first stored in memory 103. By staying in communications with digital signal processor 101, memory 103, and drive mechanism unit 105, μprocessor/controller 104 determines when to supply the stored write signals to the modulator which combines the audio data and non-audio information together into subframes, frames, and blocks that conform to the AES3/IEC format. The modulator's output is supplied to the encoder which encodes the signals in the biphase-mark format for transmitting to mechanism drive unit 105.

Digital audio I/O circuit 102 is used as a transceiver with asynchronous sample rate converter which allows the user to specify the output sample rate of the digital audio information received. Digital audio I/O circuit 102 converts the input sample rate $F_{s1}$ of the digital audio information to an output sample rate $F_{s2}$. Digital audio I/O circuit 102 is one place where the present invention may be incorporated. Digital audio I/O circuit 102 can transmit processed digital audio data with the new sample (i.e., output) rate $F_{s2}$ received from drive mechanism unit 105 via digital signal processor 101 to DAC 106 to be converted into analog signal for outputting at audio jack 107. Digital audio I/O circuit 102 can also receive analog signals from audio microphone 109 which are converted into a digital data stream using ADC 108. The converted digital data can then be sent to digital audio I/O circuit 102 to convert the sample rate and subsequently send to digital signal processor 101. Further processing is done there, before finally sending the data to drive mechanism unit 105 for writing onto the data storing medium.

Figure 2:
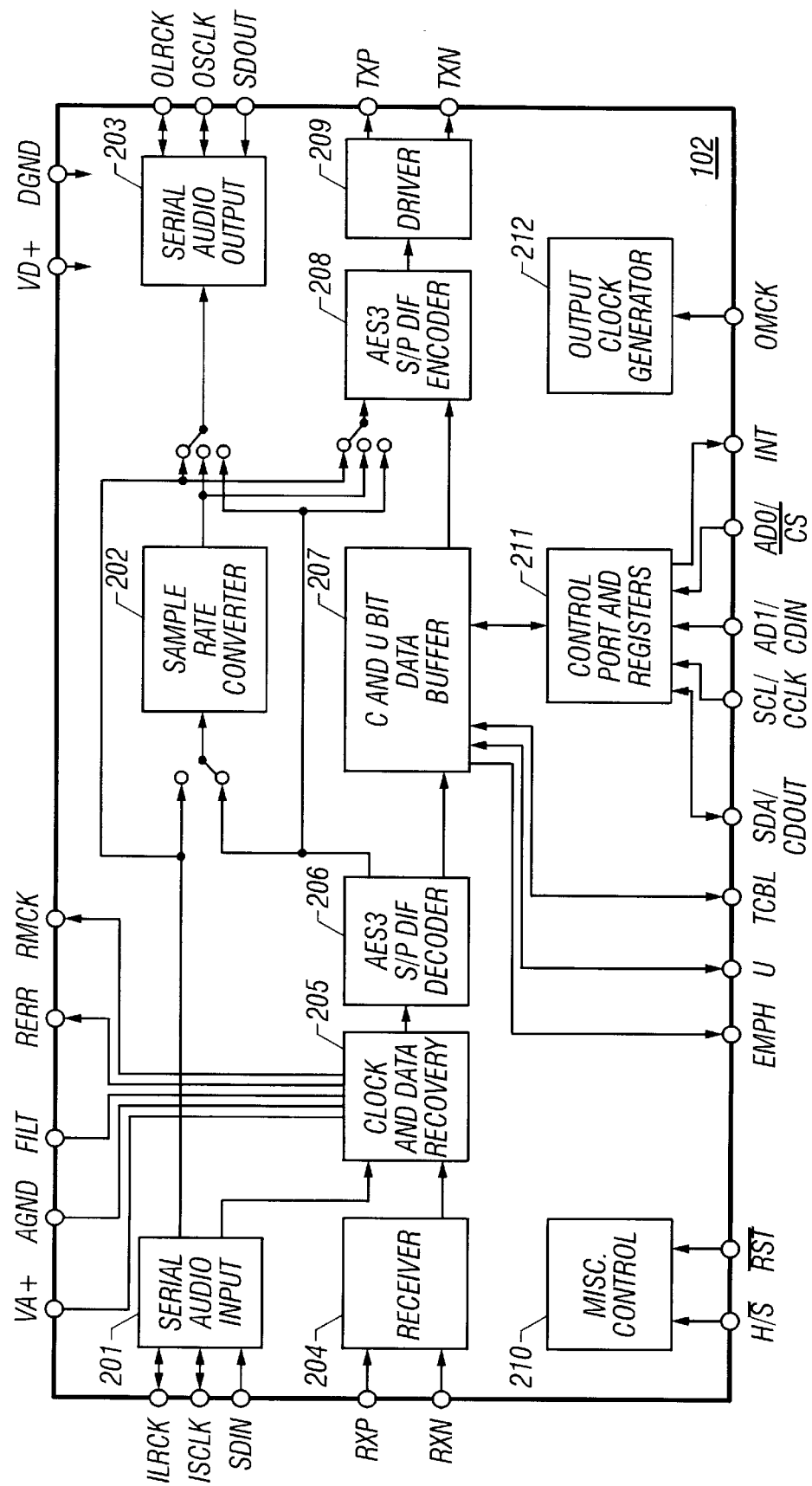
FIG. 2 is a block diagram illustrating a digital audio I/O circuit implemented, for example, in the digital audio system of FIG. 2.

FIG. 2 illustrates in more detail digital audio I/O circuit 102. In general, digital audio I/O circuit 102 comprises serial audio input circuit 201, sample rate converter (SRC) 202, serial audio output circuit 203, receiver 204, clock & data recovery circuit 205, AES3 S/PDIF decoder 206, C & U data buffer 207, AES3 S/PDIF encoder 208, driver 209, miscellaneous controller 210, control port & registers 211, and output clock generator 212.

As shown in FIG. 2, signals input left/right clock (ILRCK) (a.k.a. frame clock), input serial clock (ISCLK), and serial data input (SDIN) from a 3-wire serial format audio source are provided as inputs to serial audio input circuit 201. Serial data stream SDIN contains data for both left and right channels in an interleaved format. The polarity of ILRCK indicates which channel (left or right) is associated with the current SDIN bits. Which channel goes with which polarity depends on the particular 3 wire serial format being used. Hence, the frequency of frame clock ILRCK is equal to the sampling rate $F_{s1}$ of the left and right channel PCM (Pulse Code Modulation) data. Serial clock signal ISCLK is typically an integer multiple of the left/right clock such as 32× or 64× $F_{s1}$. Serial audio input 201 latches data from the serial data stream input to ensure that the same data is available for at least an ILRCK clock cycle. The output of serial audio input circuit 201 is made available as an input to sample rate converter 202 which converts the sample rate of the audio data from $F_{s1}$ to $F_{s2}$ and in turn makes its output available to serial audio output circuit 203 and AES3 S/PDIF encoder 208. The output of serial audio input circuit 201 is also made available as an input directly to serial audio output circuit 203 and AES3 S/PDIF encoder 208 thereby bypassing sample rate converter 202. In so doing, the sample rate of the serial audio data stream input can be changed from $F_{s1}$ to $F_{s2}$ by sample rate converter 202 or be left unchanged depending on the data path which is selectable by the user.

Digital audio I/O circuit 102 is also designed to be compatible with AES3/IEC format type audio input signals. As shown in FIG. 2, differential line input signals RXP and RXN carrying AES3/IEC format type data (a.k.a., biphase-mark format data) are provided as input to receiver 204. Receiver 204 latches biphase-mark format data to ensure that the same data is available for at least $\frac{1}{128}$ of a frame period, or 1 IU. The output of receiver 204 as well as the output of serial audio input circuit 201 are provided to clock & data recovery circuit 205. The clock recovery function of clock & data recovery circuit 205 is to recover a high-frequency, low-jitter RMCK, given a low frequency input clock. Such function is achieved with a phase-locked loop (PLL) (not shown). The low frequency input can either be the $F_{s1}$ ILRCK, or a clock derived from the biphase-mark data of receiver 204. Circuit 205 also decodes the biphase-mark data from incoming AES frames into a 1-bit serial data stream, with a data rate of $64F_{s1}$.

Master clock output signal RMCK and PLL filter signal FILT are output by the PLL which consists of phase and frequency detectors, a second-order loop filter, and a voltage controlled oscillator (VCO). Since most clock jitter introduced by digital audio data signals are high in frequency, the PLL is designed to strongly attenuate at high frequency. Frequency detectors are used to minimize the amount of time required for the PLL to lock to the incoming data stream and to prevent false lock conditions. When the PLL is not locked to the incoming serial audio data stream, the frequency detectors pull the VCO frequency within the lock range of the PLL. When no digital audio data is present, the VCO frequency is pulled to its minimum value. Receive error indicator signal RERR indicates the presence of a problem of the receiver such data validity, parity error, bi-phase coding error, confidence, and code correction (CRC) errors, as well as the loss of lock in the PLL. The PLL Master clock output signal RMCK is $256 \times F_{s1}$ and is the output of the VCO. Clock signal RMCK provides a sample frequency rate for synchronization purpose by clock & data recovery circuit 205.

The clock and data recovered from clock & data recovery circuit 205 is provided to AES3 S/PDIF decoder 206 which decodes and separates the binary information into audio and non-audio components. The non-audio components include validity (V), user (U), channel status (C), parity (P) bits. The C and U non-audio bit streams are provided as inputs to C & U bit data buffer 207 which implements the present invention. The audio data is made available as an input to sample rate converter 202 which converts the sample rate of the audio data from $F_{s1}$ to $F_{s2}$ and in turn makes its output available to serial audio output circuit 203 and AES3 S/PDIF encoder 208. The output of AES3 S/PDIF decoder 206 is also made available as an input directly to serial audio output circuit 203 and AES3 S/PDIF encoder 208 thereby bypassing sample rate converter 202. In so doing, the sample rate of the serial audio data stream input can be changed from $F_{s1}$ to $F_{s2}$ by sample rate converter 202 or be left unchanged depending on the data path which is selectable by the user.

C & U bit data buffer 207 assembles the non-audio information stream bits C and U in the desired formats/structures as well as converts their sample rate from $F_{s1}$ to $F_{s2}$. Control Port & Registers circuit 211 acts as an interface between C & U bit data buffer 207 and µprocessor 104, allowing the µprocessor 104 to transfer data, address, and control signals needed to carry out the above tasks. Control Port & Registers circuit 211 is connected to serial control data I/O (I²C)/data out (SPI) signal SDA/CDOUT, control port clock signal SCL/CCLK, address bit 1 (I²C)/serial control data in (SPI) signal AD1/CDIN, address bit 0 (I²C)/control port chip select in (SPI) signal AD0/CS, and interrupt signal INT. Signal INT indicates errors and key events during operation of digital audio I/O circuit 102. All bits effecting INT are maskable via a control register. The conditions that initiates interrupts are readable via a control register in control port & registers 211. Moreover, the polarity of the INT output as well as selection of a standard or open drain output is set via a control register.

C & U bit data buffer 207 provides the assembled non-audio information with a new sample rate $F_{s2}$ as output to AES3 S/PDIF encoder 208. The outputs of serial audio input circuit 201, sample rate converter 202, and AES3 S/PDIF decoder 206 are also made available to AES3 S/PDIF encoder 208. In so doing, depending on the mode selected by the user, AES3 S/PDIF encoder 208 can encode audio data and non-audio information into an AES3/IEC-60958 data stream to be transmitted by driver 209 over differential line driver output signals TXN and TXP.

In addition to inputs from serial audio input circuit 201 and sample rate converter 202, serial audio output circuit 203 also receives an input from AES3 S/PDIF decoder 206. Depending on the mode selected by the user, serial audio output circuit 203 allows the appropriate inputs to pass through as serial digital audio outputs with serial audio output port left/right clock output signal OLRCK, serial audio output port bit clock output signal OSCLK, or serial audio output port data output signal SDOUT. While the signal OLRCK carries the word rate clock for audio data at sample frequency rate $F_{s2}$, the signal OSCLK carries the serial bit clock for audio data.

Miscellaneous controller 210 performs hardware-software mode switching and power control tasks for digital audio I/O circuit 102. Miscellaneous controller receives control hardware or software control mode select signal H/S and reset input signal RST as input. If H/S signal is HIGH, the method of controlling the operating mode of digital audio I/O circuit 102 is hardware and device control and data access are provided by pins. On the other hand, if H/S signal is LOW, device control and data access are primarily via the control port using a microcontroller. When signal RST is LOW, digital audio I/O circuit 102 enters a low power mode and all internal states are reset. Output clock generator 212 receives as input output section master clock input signal OMCK and provides as output an output clock signal whose sample frequency must be 256×, 384×, or 512× the output sample rate $F_{s2}$.

Figure 3A:
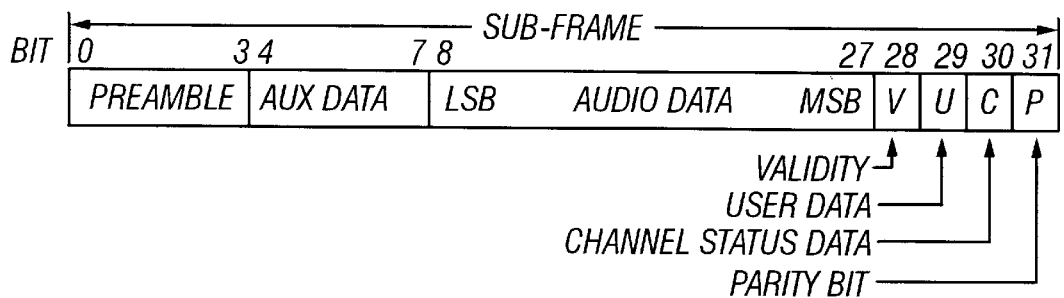
FIGS. 3A–3B are block diagrams illustrating the formats of AES3-1992/IEC-60958 digital audio data streams.
Figure 3B:
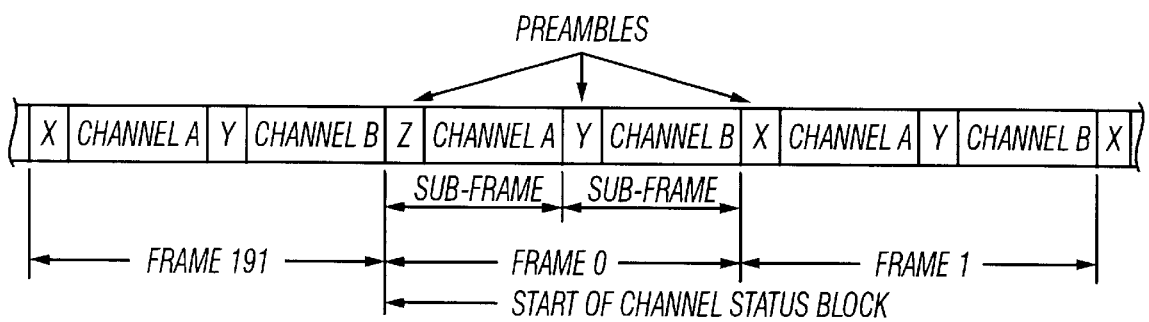

FIGS. 3A–3B illustrate the structure of the data formats described in the AES3 and IEC-60958 specifications. An AES3-1992/IEC-60958 sub-frame is shown in FIG. 3A, As shown, the AES3-1992/IEC-60958 sub-frame contains a total of 32 bits wherein 4 bits are used for the preamble, 20 bits are used for digital audio data, 4 bits are used for auxiliary data, and 1 bit is used for each validity (V), user (U), channel status (C), parity (P) bit. The pre-amble identifies the start of a sub-frame. The V bit indicates whether the audio sample is fit for conversion to analog. The C bits are sent once per subframe, and when accumulated over a number of samples, define a block of data, which conveys important information about the radio data and transmission link. The U channel is undefined and available to the user for any purpose. As such, the U and C channels are referred to as the non-audio information channels and can be used to convey control information and non-audio data.

As shown in FIG. 3B, 2 consecutive subframes (A and B) make up a frame. The two subframes A and B are also referred to as two audio channels that make up a stereo pair. Each of the two audio channels has its own channel status data with a block structure that repeats every 192 samples. In other words, 192 frames make up a block as shown, for example, in FIG. 4. The preambles that identify the start of a sub-frame are different for each of the two channels with another unique one identifying the beginning of a channel status block. Accordingly, while the first subframe of the block shown in FIG. 3B has a "Z" preamble, the rest of the subframes A have "A" preambles and all the subframes B have "B" preambles.

The different techniques for audio data sample rate conversion are well-known as discussed in the Background section. Any of the three sample rate conversion techniques (e.g., digital-analog-digital, synchronous, and asynchronous) can be used for audio data SRC 1002. Preferably, SRC 1002 implements an asynchronous sample conversion scheme. However, due to the structures of the C and U non-audio information of AES3/IEC formatted digital audio signals, different approaches are needed to perform sample rate conversion with the C and U non-audio information. More particularly, different SRC approaches may be required for the C and the U channel data bits because data in the C and U channels are structured differently from each other.

The C channel data is structured such that every bit is important. Imagine a SRC scheme in which bits enter a FIFO buffer at rate $F_{s1}$, and leave the buffer at rate $F_{s2}$. In a given time interval T, if $F_{s2}$ is not equal to $F_{s1}$, there is a different number of output audio samples ($F_{s2}$/T) than the number of input audio samples ($F_{s1}$/T). As such, depending on whether $F_{s2}$ is greater than or smaller than $F_{s1}$, C data bits can be repeated or lost which is unacceptable given the structure of the C channel data. Indeed, lossless sample rate conversion in which every input bit is re-transmitted at the output is not feasible for a buffer of finite size. Rather, a lossy scheme, in which some input bits may be omitted at the output for $F_{s2}<F_{s1}$ or some input bits may be repeated at the output for $F_{s2}>F_{s1}$, but still useful in terms of output's ability to accurately and sensibly represent input may be more realistic.

Such a lossy scheme is realizable by observing the structure of C channel data blocks and controlling the data bits that are to be omitted or repeated.

Figure 4:
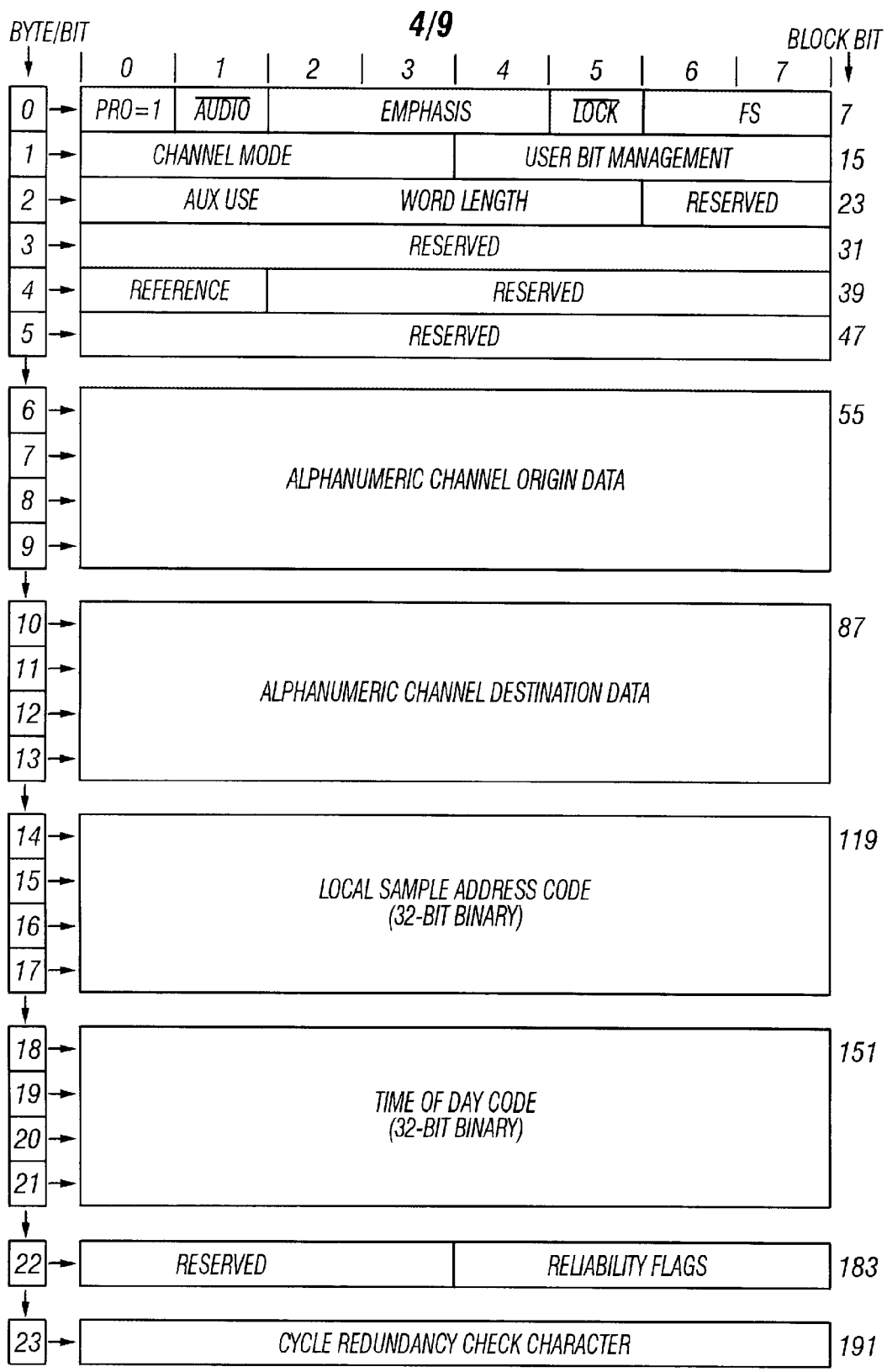
FIG. 4 illustrates the AES3-1992/IEC-60958 Channel Status (C channel data) block structure in the professional format.

C channel data is structured in blocks which consist of strings of 192 bits (24 bytes). Bits from A subframes ($C_A$) are distinct from C bits from B frames ($C_B$). FIG. 4 illustrates a C channel data block structure for the professional (broadcast) format. As shown in FIG. 4, the first bit of C channel status is set HIGH to designate that the data block is in professional format. Byte 0 of the C channel data block is used for PRO, Audio, Emphasis, Lock, and Fs status information. As discussed earlier, the PRO status bit indicates whether the data block has the professional or consumer format. The Audio status bit indicates whether the information in the C channel data block is audio or non-audio, Emphasis status bits 2–4 indicates the encoded audio signal emphasis, the Lock status bit indicates whether the source sample frequency is locked, sample frequency Fs status bits 6–7 indicate which sample frequency (e.g., 32 kHz, 44.1 kHz, or 48 kHz, etc.) is being used.

Byte 1 of the C channel data block is used for Channel Mode and User Bit Management status information. Channel Mode status bits (0–3) indicate which channel mode the data block is in (e.g., single channel, two-channels, primary/secondary, stereophonic, etc.). User Bit Management status bits (4–7) indicate whether the accompanying data bits are user defined. Byte 2 of the C channel data block is used for AUX Use and Word length status information. AUX Use status bits (0–2) indicate the particular use of the auxiliary sample bits (e.g., main audio, coordination signal, user defined application, etc.). Word length status bits (3–5) indicate the maximum word length for the audio data carried by the auxiliary sample bits. Status bits 6–7 of byte 2 are currently reserved and must be set to 0 when transmitting. Similarly, byte 3 of the C channel data block is also reserved and its bits must be set to 0 when transmitting. Bits 0–1 of the byte 4 of the C channel data block are used for Reference status information. Channel Reference status bits (0–1) indicate the type of audio reference signal used. Status bits 2–7 of byte 4 are currently reserved and must be set to 0 when transmitting. Byte 5 of the C channel data block is reserved and its bits must be set to 0 when transmitting.

Bytes 6–9 of the C channel data block are used for alphanumeric channel origin data. Bytes 10–13 of the C channel data block are used for alphanumeric channel destination data. Bytes 14–17 of the C channel data block are used for the local sample address code. Bytes 18–21 of the C channel data block are used for the time-of-day sample address code. With respect to byte 22 of the C channel data block, bits 0–3 are reserved and must be set to 0 when transmitting. Bits 4–7 are used as reliability flags to indicate whether the bytes of C channel data block are reliable. Byte 23 stores the cyclic redundancy check character (CRCC).

Figure 5:
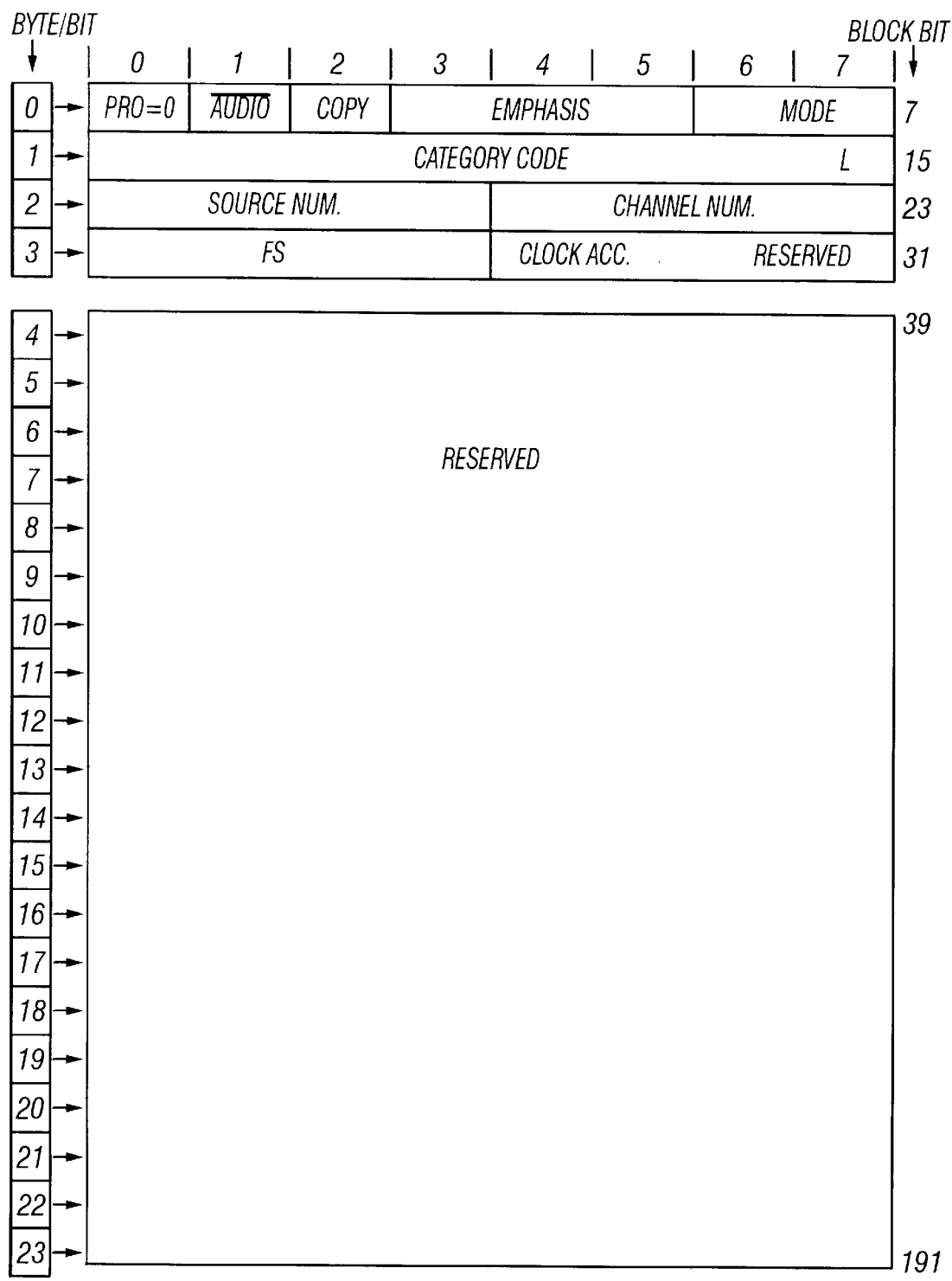
FIG. 5 illustrates the AES3-1992/IEC-60958 Channel Status (C channel data) block structure in the consumer format.

FIG. 5 illustrates a C channel data block structure for the consumer format. As shown in FIG. 5, the first bit of C channel status is set LOW to designate that the data block is in consumer format. Byte 0 of the C channel data block is used for PRO, Audio, Copy, Emphasis, and Mode status information. The PRO status bit indicates whether the data block has the professional or consumer format. The Audio status bit indicates whether the information in the C channel data block is audio or non-audio, the copy bit indicates whether the data is copyright asserted, Emphasis status bits 3–5 indicate whether or not the data is pre-emphasized and are defined differently depending on the value of the Audio status bit, the Mode status bit defines the mode of bytes 1–3 of the C channel data block. However, only one mode (00) is presently defined. Most of byte 1 defines the category code.

Bits 0–3 of byte 2 indicate the source number and bits 4–7 indicate the channel number (A to O). With respect to byte 3, bits 0–3 indicate the sample frequency Fs of the data (32 kHz, 44.1 kHz, or 48 kHz), bits 4–5 indicate the clock accuracy required, and bits 6–7 are reserved. Bytes 4–23 are all reserved and the individual bits must be set to 0 before transmitting. For a more detailed description of the two formats of the C channel status block, see for example, "AES Recommended Practice for Digital Audio Engineering—Serial Transmission Format for Two-channel Linearly Represented Digital Audio Data," AES3-1992 (ANSI S4.40-1992), Audio Engineering Society, which is herein incorporated by reference.

In general, FIGS. 4 and 5 show that C channel non-audio data cover information such as source of digital data, whether or not the data is pre-emphasized, copyright status of the data, whether the "samples" are audio data, the "sample count" of the first sample in the block (time code), etc. Since the C channel data block has a set format, it can be observed that one type of information is distinguished from another by specifying the position of each information type in the block. Hence, it is important that the block's bit sequence is preserved during sample rate conversion. It can also be observed that except for some data bits such as time code information, most of each C channel data block is unlikely to change from one block to the next. Given this, and because it is important to preserve the bit sequence of the block, a sample rate conversion scheme, that operates on entire blocks of C channel data wherein each received block may be duplicated or omitted depending on whether the input sample frequency $F_{s1}$ is less than or greater than the output sample frequency $F_{s2}$, is an effective and efficient SRC scheme for C channel data.

Figure 6:
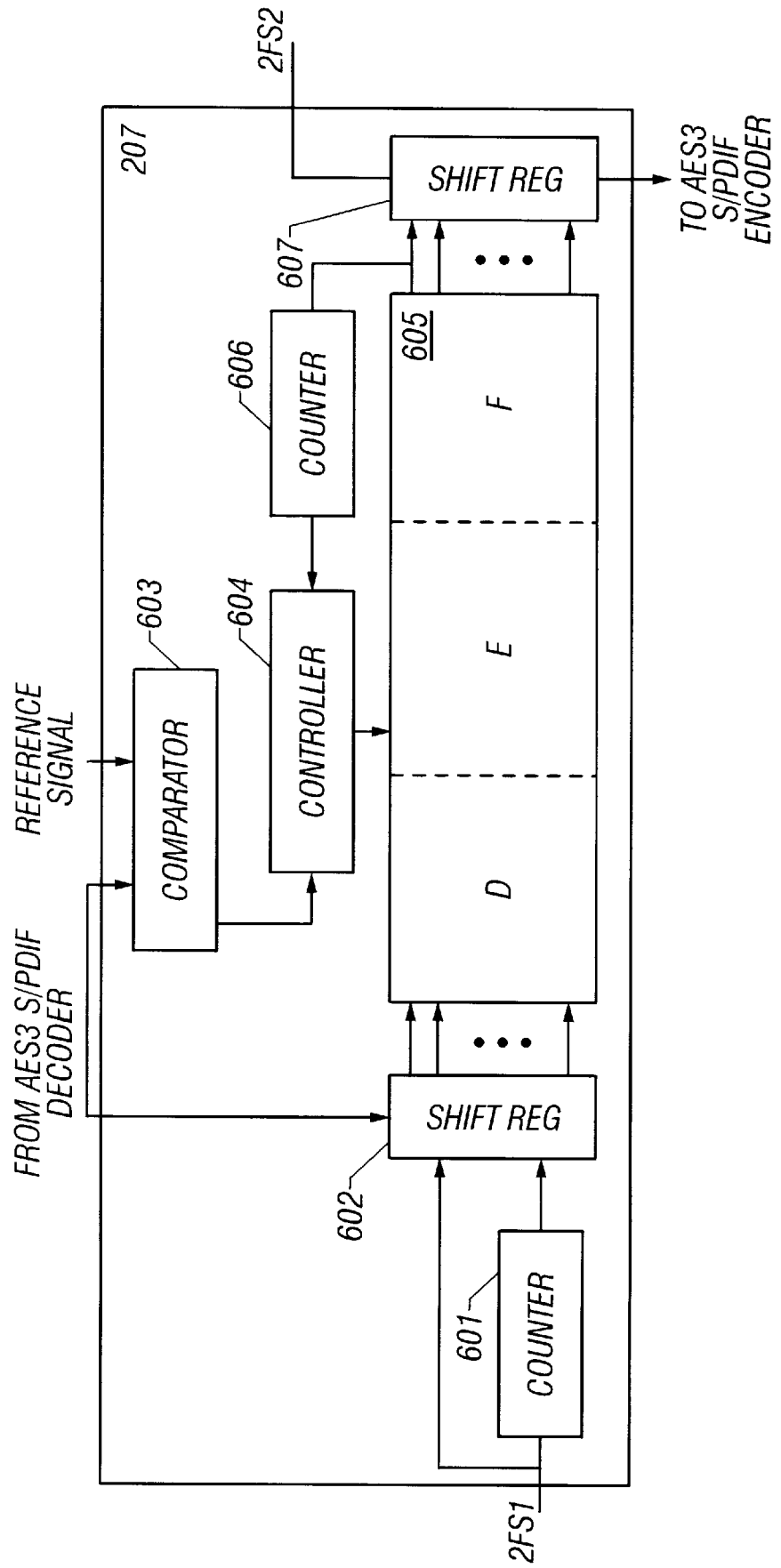
FIG. 6 illustrates an embodiment of the sample rate conversion scheme for C data in accordance to the present invention.

FIG. 6 illustrates an embodiment of the scheme to sample rate convert C channel data just discussed. As shown, C channel data sample rate conversion circuit 600, which is located inside C & U Bit Data Buffer 207, comprises counter 601, shift register(s) 602, comparator circuit 603, controller 604, random access memory (RAM) buffer 605, counter 606, and shift register(s) 607.

Under the present invention, C channel non-audio data is decoded from AES3 S/PDIF decoder 206 and sent to shift register(s) 602 serially. Shift register(s) 602 receives shift clock signal CLK1 which has a frequency of $2 \times F_{s1}$. At each clock signal CLK1, a bit of C channel non-audio data is serially shifted into shift register 602. Counter 601 also receives as input shift clock signal CLK1, incrementing its count after each received CLK1. Counter 601 monitors the count of clock signal CLK1. When the count inside counter 601 reaches fifteen (15), counter 601 resets its count to zero (0) and asserts load signal $LF_{s1}$ to shift register 602. In effect, load signal $LF_{s1}$ has a frequency of ⅛ $F_{s1}$. When the load signal is asserted, shift register 602 transfers its content of 2 bytes in parallel into RAM buffer 605.

RAM buffer 605 is partitioned into three pages D–F wherein each page is designed to have the storage capacity to store an entire C channel data block of 2×192 bits. Preferably, each of the three pages of RAM buffer 605 is organized into 24 columns, wherein each column contains 2 bytes of data, one byte from each sub-frame A & B, in accordance to the C channel formats illustrated in FIGS. 4–5. Data from a C channel data block received via shift register 602 is transferred under the control of controller 604 into a page of RAM buffer 605. More particularly, controller 604 determines which page of RAM buffer 605 is used to store data received from a C channel data block. To do so, controller 604 has three registers 1–3 that are assigned to the three pages, wherein each register stores the pointer of the first memory address location of a memory page. As such, the registers provide the links to the C channel data blocks currently stored in the three pages of RAM buffer 605.

By replacing the pointer in a first register with the pointer in a second register, a data block is effectively copied from one page to another page. For example, assume that registers 1–2 are assigned to pages D–E, respectively. By writing the content (pointer) of register 1 into register 2, the data block in page D is written into page E in an expeditious fashion. Hence, by switching the pointers in the three page registers, data blocks are quickly transferred between the three pages which is crucial in the present invention. To further ease speed requirements, RAM buffer 605 is clocked with a $128F_{s2}$ clock. Moreover, being a RAM, data inside any page can be accessed for data modification purposes. This may be needed when data blocks are omitted or repeated as a result of the input sample rate $F_{s1}$ being different from the output sample rate $F_{s2}$.

In accordance with the present invention, C channel block data is first transferred to page D of RAM buffer 605 via shift register 602 at a rate of $2F_{s1}$ bits per second. Data transfer from page D to page E is not initiated until page D is filled completely with an entire C channel data block of 2×192 bits. To monitor whether a whole C channel data block has been loaded into page D of buffer 605, memory controller 604 relies on the output of comparator circuit 603.

Comparator circuit 603 has a counter that is clocked at a $F_{s1}$ rate and is used to determine whether a whole C channel data block has been loaded into page D. This counter is reset every time a Z-preamble, which indicates the start of a C channel data block is received, is detected. The detected received Z signal RCBL is generated in clock & data recovery circuit 205 of FIG. 2. Preferably, the output signal from the counter is asserted HIGH when a Z-preamble is detected, and LOW at all other times. When the output signal from the counter is HIGH, comparator circuit 603 asserts a signal HIGH to indicate that page D of buffer 605 has received a complete data block and can begin to transfer its content.

In response to the HIGH signal from comparator circuit 603, controller 604 swaps the pointer address from register 1, which is assigned to page D, with the pointer address from register 2, which is assigned to page E. In so doing, data blocks previously stored in pages D and E are now swapped which in effect constitutes a data transfer. Following this operation, page D is now ready to receive a new data block, while page E contains the complete block that was previously in D.

The data transfer from page E to F is different from the transfer from page D to E because the user's ability to modify data stored in page E must be taken into consideration. For example, assume that $F_{s2}$ is much greater than $F_{s1}$. In this case, numerous E-to-F transfers may occur before the next D-to-E transfer is made. Assume that before the first E-to-F transfer, the user has modified data in page E via control port & registers 211. If an E-to-F data transfer is performed by swapping pointers like the D-to-E data transfer, while the first E-to-F transfer may be fine, the second transfer is not. This is because instead of transferring the modified data block from page E to F, the unmodified data block is transferred which is undesirable. To overcome this problem, in addition to swapping pointers as discussed, the data block in page E is actually copied to page F. While copying may require more memory accesses (e.g., 24 memory accesses), the delay impact is greatly alleviated if RAM buffer 605 is clocked by a high enough frequency clock (e.g., 128 $F_{s2}$), and control port & registers 211 or data transfer operations to page D are allowed to interrupt the long copying operations.

Under the present invention, the data block from page E is not transferred into page F unless all the data in page F has been output to shift register 607. To monitor whether a whole C channel data block has been output from page F of buffer 605 to shift register 607, memory controller 605 relies on the output of counter 606. Counter 606 monitors the number data bits output from page F of buffer 605 to shift register 607. Data is transferred from page F to shift register 607 at $2F_{s2}$ bits per second. When all 2×192 bits of the data block, stored in page F of buffer 605 has been output, counter 606 asserts a signal to memory controller 604 which then copies the pointer address in register 2 to register 3. Accordingly, under the present invention, a data block may be omitted from outputting to shift register 607 if the output sample frequency $F_{s2}$ is less than the input sample frequency $F_{s1}$ and a data block may be output repeatedly to shift register 607 if the output sample frequency $F_{s2}$ is greater than the input sample frequency $F_{s1}$.

Shift register 607 receives shift clock signal CLK2 which has a frequency of 2×$F_{s2}$. At each clock signal CLK2, a bit of C channel non-audio data is serially shifted out of shift register 607 to AES3 S/PDIF encoder 205.

Controller 604 is also used to access data in page E of buffer 605 for data modification purposes. As discussed, due to the sample rate difference, some inputted data blocks can be omitted or repeated which disrupt the sample count and time code information in output blocks. By allowing users to access the contents of page E, the above problem is alleviated. For example, to keep accurate sample counts in the output, users can write the desired values into the appropriate sample count fields of page E which will propagate to AES3 S/PDIF encoder 206. In another example, users can write zeros (0) into the sample count fields thereby disabling this portion of the output C channel data block in a controlled fashion. In the preferred embodiment, memory controller 603 receives modified data, addresses, and commands from control port & register 212 in performing these data access operations. Memory controller 604 can also be programmed through control port & register 212 to prevent overwriting of specified data bytes. This feature overwrite-prevention makes it more convenient for users to modify data stored in page E because it only requires them to do it once, instead of repeatedly immediately after each D-to-E transfer. It is clear that a memory controller like memory controller 604 is obvious and well-known to persons of ordinary skill in the art.

With respect to the sample conversion of U channel data, the U channel data is not generally structured in a block structure. While there is no universal format for U channel data, a widely used format is defined in the IEC-60958 standard. In general, U channel data is organized into messages, each of which consists of up to 129 information units (IUs). Each IU consists of a start bit, which always has a logical value "1", followed by 7 information bits. The 8 bits of an IU are referred to as the P, Q, R, S, T, U, V, and W bits wherein P is the start bit, and Q–W are the information bits. The IUs within a message are separated with sequences of zero's (0's), defined here as filler. Filler sequences that separate IUs within the same message, referred to herein as inter-IU filler, may have lengths of 0 to 8 bits. Filler sequences of length 9 or more denote a gap between messages, and are referred to herein as inter-message filler. For a detailed description of the IEC-60958 U channel data format, see "*Audio, Video and Multimedia Subsystems and equipment,*" 100C/107/CD (IEC-60958-3 Ed2), International Electrotechnical Commission, which is herein incorporated by reference.

Reference is now made to FIGS. 7A–7B illustrating the U channel data format as defined in the IEC-60958 standard. As shown in FIG. 7A, while the start bit (P) of an IU has a logical 0, information bits Q–W can be either 1 or 0. FIG. 7B shows, as an example, a U channel data message having three IUs separated by inter-IU filler segments of length 4 and an inter-message filler segment of length 9.

Figure 10A:
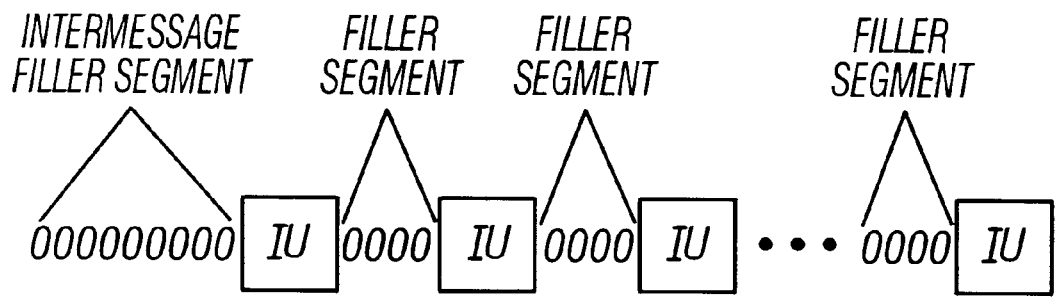
FIGS. 10A–10B respectively illustrate, as an example, the input U Channel Data Message with the original inter-IU filler segments and the output U Channel Data Message with the modified inter-IU filler segments.
Figure 10B:
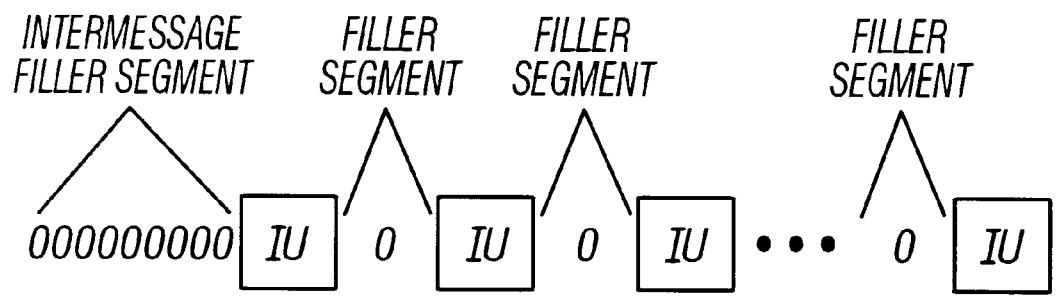

Because the filler segments do not carry significant information when the data is decoded, under the present invention, an embodiment of lossy sample rate conversion for U channel data involves preserving the IUs from input to output but altering the length of the filler segments as appropriate to accommodate different input and output sample frequencies. For example, assume the ratio of the input-to-output sample frequencies $F_{s1}/F_{s2}$ is 4/3 and the input inter-IU filler segment length is 4. In this example, the IUs can be preserved from input to output by changing the output inter-IU filler segment length to 1. This allows an IU plus an inter-IU filler segment of 1 to be output in the same time it takes the IU plus a filler segment of 4 to be input. FIGS. 10A–10B illustrate the input U channel data block and the output U channel data block, respectively. Accordingly, a general formula for the output filler segment length (OF) relative to the input filler segment length (IF), input sample frequency ($F_{s1}$), and output sample frequency ($F_{s2}$) has been developed as follows:

$$OF=((IF+8)\times(F_{s2}/F_{s1}))-8 \qquad (2)$$

As an alternative embodiment, entire messages can be buffered and differing $F_{s1}$ and $F_{s2}$ can be accommodated by varying the length of the output inter-message filler segment relative to the input inter-message filler segment length (IM). Such a scheme requires a buffer memory large enough to store up to 129 IUs. In addition, IF need not be stored if the smallest observed IF ($IF_{min}$) is used as OF during output. By omitting storage of IF segments, the size requirement of the buffer memory can be as small as 1032 bits (129×8 bits). The above alternative scheme works for any $F_{s2}$ greater than $F_{s1}$, and also for any $F_{s2}$ less than $F_{s1}$ in which the input inter-message filler segments (IM) satisfy the following inequality.

$$IM \geq ceil([(F_{s1}/F_{s2})-1]\times[8N+(N-1)IF+9]+9) \qquad (3)$$

where N is the number of IUs in the message and the function ceil denotes always rounding fractions to up the next integer.

In the event the U channel data is not formatted according to the IEC-60958 standard, the three-page block scheme used for C channel data that is described earlier may be used as yet another alternative embodiment. Accordingly, the preferred embodiment of lossy U channel data sample rate conversion involves hardware that implement all 3 choices in which the user may select whichever embodiment is most suitable for his need. More particularly, the hardware implementation of the present invention involves re-using certain components in supporting all 3 schemes. For example, the buffer RAM can be configured in different ways to support each scheme. As such, the hardware implementation of the 3 schemes are efficiently carried out.

In general, the lossy U channel data sample rate conversion schemes in the present invention consist of three stages as illustrated in FIG. 8. In the first stage (hereinafter the ubm_rx_to_ram stage), incoming U data from AES3 S/PDIF decoder 206 decoded into IUs and filler segments in the two IU-based schemes, and are grouped into pieces usable by the memory in the message-based and block-based schemes. Additionally, handshaking signals are generated to establish communications with the second stage prior to transferring the IUs. In the second stage (hereinafter the uramcont stage), RAM access requests to read, write, or copy are arbitrated. Also, the buffer RAM itself is inside this block. Moreover, handshaking signals between control port & registers 211 and C & U bit data buffer 207 are generated. The third stage (hereinafter the ubm_ram_to_tx stage) retrieves IUs from the uramcont stage and converts these IUs into a serial output data stream. In the preferred embodiment, each of the three stages ubm_rx_to_ram, uramcont, and ubm_ram_to_tx is controlled by a separate and independent state machine aptly named.

Figure 9:
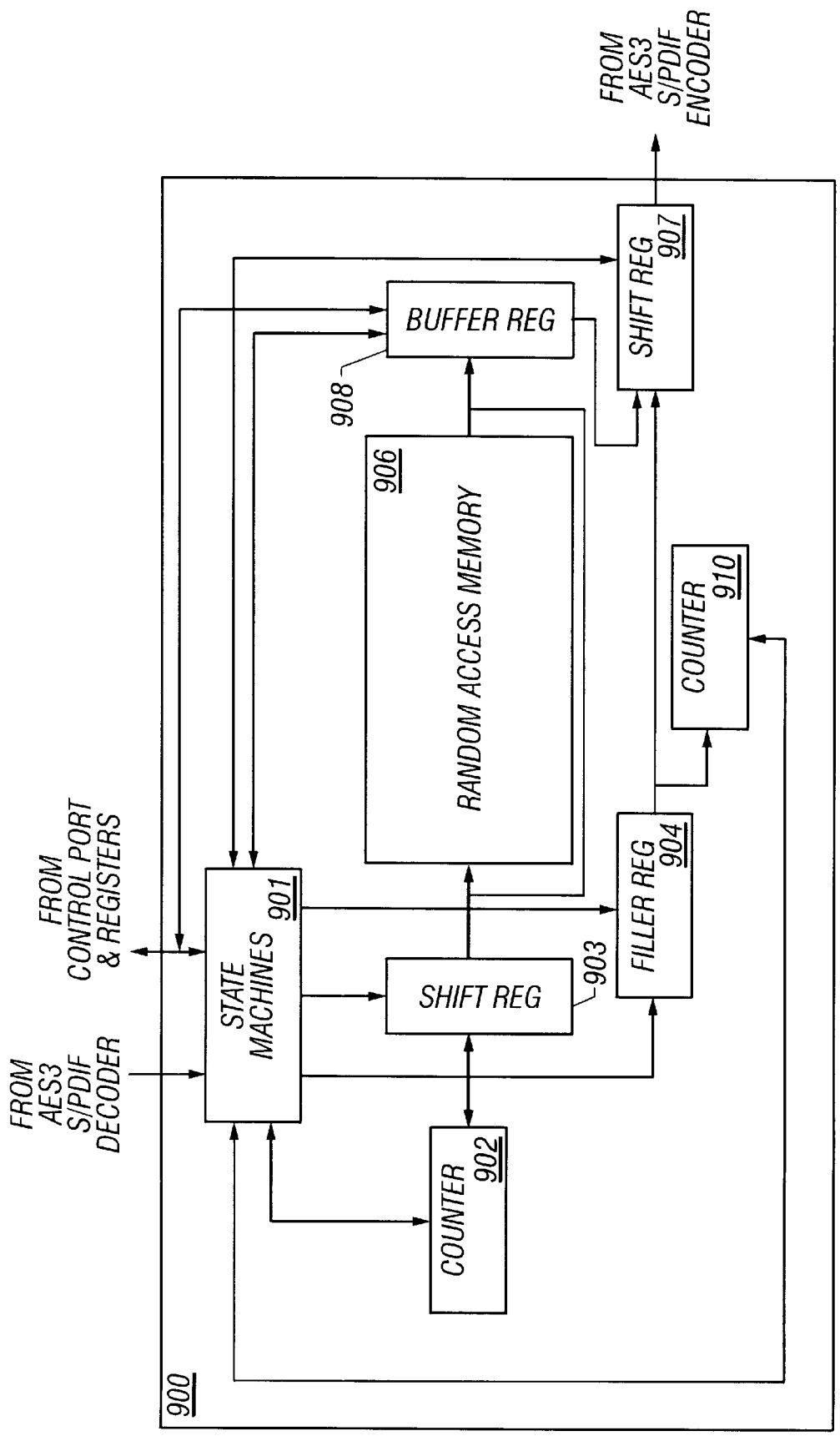
FIG. 9 illustrates an embodiment of the sample rate conversion scheme for U data in accordance to the present invention.

FIG. 9 illustrates the hardware implementation of the lossy U channel data sample rate conversion methods described above. As shown in FIG. 9, lossy U channel data SRC 900, which is implemented inside C & U Bit Data Buffer 207, comprises state machines 901, counter 902, shift register(s) 903, filler register 904, controller 905, RAM buffer 906, message filler counter 907, buffer register 908, shift registers 909, and counter 910.

State machines 901 include a ubm_rx_to_ram state machine, a uramcont state machine, and a ubm_ram_to_tx state machine. State machines 901 receive as inputs data from AES3 S/PDIF decoder 204, control signals and RAM access requests from control port & registers 211, as well as a number of signals from various components of SRC. In response, state machines 901 generate control signals to operate the components of lossy U channel data SRC 900 in carrying out the steps of the three stages: ubm_rx_to_ram, uramcont, and ubm_ram_to_tx. For the ubm_rx_to_ram stage, the ubm_rx_to_ram state machine from state machines 901 first stays in a standby state until it receives an asserted signal sync_r from AES3 S/PDIF decoder 206 which indicates that new U channel data is being sent from AES3 S/PDIF decoder 206. Subsequently, the ubm_rx_to_ram state machine receives either mode_is_block, mode_is_iec1, or mode_is_iec2 signal from control port & registers 211. These signals indicate which of the 3 SRC schemes is to be used. Exactly one of the signals will be true, with meanings as shown in the following table:

TABLE 1

| Asserted Signal | U SRC Scheme To Be Used |
| --- | --- |
| mode_is_block | Block Buffering |
| mode_is_iec1 | IU Buffering |
| mode_is_iec2 | Message Buffering |

Hardware usage and implementation details of each scheme appear below.

In the Block Buffering scheme, the received U channel data is to be stored as a block of 2×192 bits (i.e., like a C channel data block described earlier). The ubm_rx_to_ram state machine inside block 901 serially transfers U channel data into shift register(s) 903 without trying to separate IUs from filler segments. When shift register(s) 903 is filled up with 16 received U bits, its content is sent in parallel to page D of RAM 906. In general, this scheme is similar to the C channel data conversion scheme discussed earlier. The state machines 901 are operated in a manner that causes shift registers 903 and 907 to perform the same functions as shift registers 602 and 607 of FIG. 6, in the C scheme already discussed. In other words, the state machines perform the same function as controller 604. RAM 906 is configured to act as RAM buffer 605 (e.g., 3 pages of 24×16 bits each, called 'D,' 'E,' and 'F'). The only significant difference that the block mode of U channel data conversion scheme does not have the overwrite prevention feature that the C channel data scheme does.

In these schemes, the U data is assumed to be formatted as described in IEC-60958, where the U data is composed of sequences of IUs which form messages. Filler segments occur between the IUs within a message, and also between messages. As a first step in processing this format, the ubm_rx_to_ram state machine searches the incoming data for the beginning of a message, by looking for sequences of 0's. A sequence with length 9 or greater is considered an intermessage gap, and the first '1' occurring after the gap is recognized as the P bit of the first IU in a message. After this initial step is complete, the state machine is able to distinguish IUs from filler, and one message from the next.

In this scheme, the ubm_rx_to_ram state machine causes IUs to serially shift into shift register(s) 903. As soon as a complete IU has shifted into shift register 903, it is sent directly to buffer register 908. RAM 906 is bypassed in this scheme. The data that just arrived in buffer register 908 is transferred to shift register 907 at the next occurrence of CLK2. Data is serially shifted out of shift register 907 by CLK2. Every time a bit is shifted out of 907, a '0' bit shifted into its other end. 8 CLK2's after receiving an IU from buffer register 908, all bits in the IU will have been shifted out of shift register 907, so that on subsequent CLK2's 0's shift out, forming inter-IU filler segments. This continues until the next load from buffer register 908, at which time the shifting of the new IU begins. In this manner, input IUs are faithfully reproduced at the output, and the lengths of output inter-IU filler segments are adjusted relative to the input lengths, accommodating the difference between $F_{s1}$ and $F_{s2}$. An example of this scheme is included in the discussion associated with FIGS. 10A–10B above.

In this scheme, the ubm_rx_to_ram state machine causes pairs of IUs to be collected in shift register 903. These IUs are subsequently sent to RAM 906 which is organized into a single page of 72×16 bits. Prior to transferring the content of shift register 903 into RAM 906, the ubm_rx_to_ram state machine generates handshaking signals to ensure that RAM 906 receives the data when it is ready. The ubm_rx_to_ram state machine next determines whether the next input data bit received from AES3 S/PDIF decoder 206 is part of a filler segment or part of the next IU (e.g., a zero (0) or a one (1)). If the next bit is part of a filler segment, the ubm_rx_to_ram state machine retrieves all the bits in the segment, counting the segment's length as it goes. If the length is 9 or greater, the state machine realizes that it has seen an intermessage gap, and sends control signals to the other state machines, so that they know that RAM 906 contains one more complete message. If the filler segment is 8 or less, the value of the length is compared to the value in register 904, which is the length of the shortest filler segment observed so far ($IF_{min}$). If the new length is less than $IF_{min}$, register 904 is updated with the new length, creating a new $IF_{min}$. Whenever the filler segment ends (e.g., when a '1' U bit occurs), the next IU is shifted into shift register 903, which subsequently transfers its content into RAM 906. This process repeats indefinitely.

Whenever a complete message has been written into RAM 906, the ubm_ram_to_tx state machine begins to transfer its IUs from the RAM into buffer register 908, in chunks of 2 IUs. This state machine also handles the data transfer from buffer register 908 to shift register 907, inserting inter_IU filler segments between the IUs as they shift out of 907. The length of these inter_IU filler segments is $IF_{min}$, where $IF_{min}$ is the length of the shortest observed input filler segment stored in register 904. When all bits in 907 have been shifted out, the state machine requests more IUs from RAM 906. When the RAM is able to service the request, the IUs are transferred to buffer register 908, and from there to shifter 907, beginning the IU output process anew.

When all the IUs in the message have been output, a minimal length intermessage filler segment of length 9 is output. After this, one of two things is done. If more messages are present inside RAM 906, the first of them is read out through buffer 908 into shift register 907 and serially output, according to the process just described. If there are no complete messages in the RAM, 0's are output until there is one.

The uramcont stage is controlled by the uramcont state machine from state machines 901. In general, this controller services and arbitrates between requests to transfer data to/from RAM 906 or between the pages of the RAM itself. As mentioned earlier, RAM 906 is organized into a single page of 72×16 bits in this SRC scheme and control port access is not allowed. Therefore, the only possible access requests are write operation from 903 or read operations to 908.

It should be clear to person of ordinary skill in the art that the hardware implementation of the C and U channel data SRC schemes described above can be combined to operate as a single unit or separated to operate as individual units.

The preferred embodiment of the present invention, an apparatus, system and method to sample rate convert U and C channel non-audio data, is thus described. While the present invention has been described in particular embodiments, the present invention should not be construed as limited by such embodiments, but rather construed according to the below claims.

What is claimed is:

1. A sample rate converter for converting an input sample frequency $F_{s1}$ of a signal carrying digital data formatted in blocks of a predetermined size to an output sample frequency $F_{s2}$ comprising:
    a first register receiving digital data, the first register is clocked by a first clock signal having a frequency $F_{s1}$;
    a memory coupled to an output of the first register, the memory partitioned into at least three pages, each of the at least three pages having sufficient capacity to store a block of the digital data;
    a second register coupled to an output of the memory, the second register is clocked by a second clock signal having a frequency $F_{s2}$; and
    a controller coupled to the memory, the controller arbitrating access requests to the memory, the controller performing the access requests including transferring data from the first register to the memory, transferring the block of the digital data between the at least three pages, performing read and write operations on the block of the digital data contained in the memory, and transferring the block of the digital data from the memory to the second register, so that the frequency $F_{s1}$ of a signal carrying the block of the digital data is converted to another signal having the frequency $F_{s2}$.

2. The sample rate converter of claim 1, wherein each of the at least three pages has a correspondent register storing a pointer to a current starting address of the page, data is transferred from a first page to a second page by swapping pointers stored in the registers corresponding to the first and second pages.

3. The sample rate converter of claim 2, wherein the memory is a random-access-memory (RAM).

4. The sample rate converter of claim 3, wherein the data stored in the second page of the RAM is modified as desired prior to being transferred to a third page of the RAM.

5. The sample rate converter of claim 4, wherein the data is transferred from the second page to the third page by swapping pointers stored in the registers corresponding to the second and third pages as well as copying the data stored in the second page to the third page.

6. The sample rate converter of claim 1, wherein the digital data are formatted according to AES3-1992/IEC60958 Channel Status format.

7. The sample rate converter of claim 1 wherein the controller transfers the digital data from a first page of the at least three pages to a second page of the at least three pages at a rate of two times the frequency $F_{s1}$, the controller does not transfer the digital data until the first page is completely filled with an entire block of the digital data, and the controller does not transfer the digital data from the second page to a third page of the at least three pages until all of the digital data in the third page is output to a shift register.

8. A sample rate converter for converting an input sample frequency $F_{s1}$ of a signal carrying digital data formatted as packets, wherein a plurality of packets with interleaved filler segments make up a message, to an output sample frequency $F_{s2}$ comprising:
- a first register receiving digital data, the first register is clocked by a first clock signal having a frequency $F_{s1}$;
- a memory coupled to an output of the first register, the memory having sufficient capacity to store a plurality of packets of the digital data in a message;
- a second register coupled to an output of the memory;
- a third register receiving as input the digital data output from the second register, the third register is clocked by a second clock signal having a frequency $F_{s2}$;
- a fourth register for storing a $IF_{min}$ value representing a smallest filler segment length within a message; and
- a state machine coupled to the first register, the second register, the third register, the fourth register, and the memory, the state machine separating filler segments from the packets of the digital data, the state machine providing the packets of the digital data to the first register, the state machine arbitrating access requests to the memory, the state machine performing the access requests including transferring the digital data from the first register to the memory and transferring the digital data from the memory to the second register, the state machine transferring the digital data from the second register to the third register, the state machine storing the $IF_{min}$ value in the fourth register, the state machine outputting the packets from input messages from the third register with interleaved filler segments having a length according to the $IF_{min}$ value between the packets to form output messages, the state machine outputting the filler segments if there are no packets to output.

9. The sample rate converter of claim 8, wherein the memory is a random-access-memory (RAM).

10. The sample rate converter of claim 8, wherein the digital data are formatted according to AES3-1992/IEC60958 Channel Status format.

11. A sample rate converter for converting an input sample frequency $F_{s1}$ of a signal carrying digital data formatted as packets, wherein a plurality of packets with interleaved filler segments make up a message, to an output sample frequency $F_{s2}$ comprising:
- a first register receiving digital data, the first register is clocked by a first clock signal having a frequency $F_{s1}$;
- a second register receiving as an input digital data output from the first register;
- a third register receiving as an input digital data output on the second register, the third register is clocked by a second clock signal having a frequency $F_{s2}$; and
- a state machine coupled to the first register, the second register, and the third register, the state machine performing the following steps:
  a) separating input filler segments from packets of digital data,
  b) providing the packets of the digital data to the first register one at a time,
  c) transferring the digital data from the first register to the second register,
  d) transferring the digital data from the second register to the third register,
  e) outputting the digital data from the third register at a rate of the frequency $F_{s2}$,
  f) outputting filler segments at the rate of the frequency $F_{s2}$ until a start of a subsequent digital data packet transfer, and
  g) repeating steps c)–f).

12. The sample rate converter of claim 11, wherein the digital data are formatted according to AES3-1992/IEC60958 Channel Status format.

13. A digital audio system comprising:
- a drive mechanism unit;
- a plurality of digital signal processors coupled to the drive mechanism unit;
- a central processor coupled to the plurality of digital signal processors;
- a digital audio input/output (I/O) circuit coupled to the digital signal processors, the digital I/O circuit having a sample rate converter for converting an input sample frequency $F_{s1}$ of a signal carrying digital data formatted in blocks of a predetermined size to an output sample frequency $F_{s2}$ comprising:
  a first register receiving digital data, the first register is clocked by a first clock signal having a frequency $F_{s1}$;
  a memory coupled to an output of the first register, the memory partitioned into at least three pages, each of the at least three pages having sufficient capacity to store a block of the digital data;
  a second register coupled to an output of the memory, the second register is clocked by a second clock signal having a frequency $F_{s2}$; and
  a controller coupled to the memory, the controller arbitrating access requests to the memory, the controller performing the access requests including transferring the digital data from the first register to the memory, transferring the digital data block between the three pages, performing read and write operations on the digital data contained in the memory, and transferring the digital data from the memory to the second register.

14. The digital audio system of claim 13, wherein each of the at least three pages has a correspondent register storing a pointer to a current starting address of each of the at least three pages, data is transferred from a first page to a second page by swapping pointers stored in the registers corresponding to the first and second pages.

15. The digital audio system of claim 14, wherein data stored in the second page of the memory is modified as desired prior to being transferred to a third page of the memory.

16. The digital audio system of claim 15, wherein the data is transferred from the second page to the third page by swapping pointers stored in the registers corresponding to the second and third pages as well as copying the data stored in the second page to the third page.

17. The digital audio system of claim 13, wherein the digital data are formatted according to AES3-1992/IEC60958 Channel Status format.

18. The digital audio system of claim 13 wherein the controller transfers the digital data from a first page of the at least three pages to a second page of the at least three pages at a rate of two times the frequency $F_{s1}$, the controller does not transfer the digital data until the first page is completely filled with an entire block of the digital data, and the controller does not transfer the digital data from the second page to a third page of the at least three pages until all of the digital data in the third page is output to a shift register.

19. A method to convert an input sample frequency $F_{s1}$ of a signal carrying digital data formatted in blocks arriving at a rate of $F_{s1}/B$ to an output sample frequency $F_{s2}$, wherein B is a predetermined integer, the method comprising the steps of:

in a N-page memory wherein each page having capacity to store a block of digital data, successively storing each block of the digital data in a first page of the N-page memory at a rate $F_{s1}/B$ wherein $F_{s1}$ is an input sample frequency of a signal carrying the digital data and B is a predetermined integer;

transferring the block of the digital data stored in the first page of the N-page memory to the second page of the N-page memory at the rate $F_{s1}/B$ wherein the digital data is not transferred to the second page until the first page is completely filled with an entire block of the digital data;

transferring the block of the digital data stored in a $(N-1)^{th}$ page of the N-page memory to a $N^{th}$ page of the N-page memory at a rate $F_{s2}/B$ wherein $F_{s2}$ is an output sample frequency and wherein the digital data is not transferred from the $(N-1)^{th}$ page to the $N^{th}$ page until all of the digital data in the $N^{th}$ page is output to a shift register; and outputting the block of the digital data stored in the $N^{th}$ page of the N-page memory.

20. The method of claim 19, further comprising the step of modifying the block of the digital data stored in the $(N-1)^{th}$ page prior to transferring the block of the digital data stored in the $(N-1)^{th}$ page to the $(N)^{th}$ page.

21. The method of claim 19, wherein the N has an integer value of 3 or more.

22. The method of claim 21, wherein each of the at least three pages has a correspondent register storing a pointer to a current starting address of each of the at least three pages, the digital data is transferred from a first page to a second page by writing a pointer stored in the register corresponding to the first page to the register corresponding to the second page.

23. The method of claim 19, wherein the digital data is transferred from the $(N-1)^{th}$ page to the $(N)^{th}$ page by swapping pointers stored in registers corresponding to the $(N-1)^{th}$ and $(N)^{th}$ pages as well as copying the digital data stored in the $(N-1)^{th}$ page to the $(N)^{th}$ page.

24. The method of claim 19, wherein the digital data are formatted according to AES3-1992/IEC-60958 Channel Status format.

25. The method of claim 19, wherein a transfer of a block of digital data between the second page and the (N−1) page preserves structure of the block.

26. A method to convert an input sample frequency $F_{s1}$ of a signal carrying digital data formatted as packets, wherein a plurality of packets with interleaved filler segments make up a message, to an output sample frequency $F_{s2}$ comprising the steps of:

storing digital data from a message in a memory at a rate according to an input sample frequency $F_{s1}$; and outputting an output sign at a rate according to an output sample frequency $F_{s2}$ by outputting the digital data stored in the memory at the rate according to the output sample frequency $F_{s2}$ if the digital data does exist in the memory having at least a first page, a second page, and a third page and outputting filler segments at the rate according to the output sample frequency $F_{s2}$ if the digital data does not exist in the memory, and wherein the digital data is not transferred to the second page until the first page is completely filled with an entire block of the digital data and wherein the digital data is not transferred from the second page to the third page until all of the digital data in the third page is output to a shift register.

27. The method of claim 26, wherein the digital data are formatted according to AES3-1992/IEC-60958 Channel Status format.

28. A method to convert an input sample frequency $F_{s1}$ of a signal carrying digital data formatted as packets, wherein a plurality of packets with interleaved filler segments make up a message, to an output sample frequency $F_{s2}$ comprising the steps of:

separating a plurality of packets from filler segments;

receiving a packet of digital data in a first register at a rate according to an input sample frequency $F_{s1}$;

upon receiving the packet of the digital data in the first register, transferring the packet of the digital data stored in the first register to a second register;

outputting the packet of the digital data stored in the second register at a rate according to an output sample frequency $F_{s2}$; and subsequently, outputting filler segments at the rate according to the output sample frequency $F_{s2}$ until a start of a subsequent digital data packet transfer from the first register to the second register.

29. The method of claim 28, wherein the digital data are formatted according to AES3-1992/IEC-60958 Channel Status format.

\* \* \* \* \*